United States Patent [19] [11] Patent Number: 5,055,421
Birkle et al. [45] Date of Patent: Oct. 8, 1991

[54] METHOD FOR THE PLASMA DEPOSITION OF HYDROGENATED, AMORPHOUS CARBON USING PREDETERMINED RETENTION TIMES OF GASEOUS HYDROCARBONS

[75] Inventors: Siegfried Birkle, Höchstadt; Johann Kammermaier, Unterhaching; Rolf Schulte, Erlangen; Albrecht Winnacker, Erlangen; Gerhard Rittmayer, Erlangen, all of Fed. Rep. of Germany

[73] Assignee: Siemens Aktiengesellschaft, Berlin and Munich, Fed. Rep. of Germany

[21] Appl. No.: 458,716

[22] PCT Filed: Jun. 14, 1988

[86] PCT No.: PCT/EP88/00526

§ 371 Date: Feb. 5, 1990

§ 102(e) Date: Feb. 5, 1990

[87] PCT Pub. No.: WO89/01237

PCT Pub. Date: Feb. 9, 1989

[30] Foreign Application Priority Data

Aug. 3, 1987 [DE] Fed. Rep. of Germany ....... 3725700

[51] Int. Cl.[5] .................. H01L 21/00; H01L 21/02; H01L 21/205; H01L 21/314
[52] U.S. Cl. .................. 437/101; 437/102; 437/103; 437/225; 437/228; 427/38; 427/39; 427/41; 148/DIG. 1; 357/2; 118/50.1; 118/620
[58] Field of Search .............. 437/101, 225, 228, 233, 437/102, 103; 427/38, 39, 41; 148/DIG. 1; 357/2; 118/50.1, 620

[56] References Cited

U.S. PATENT DOCUMENTS 3,814,983 6/1974 Weissfloch et al. ................. 204/164
4,630,566 12/1986 Asmussen et al. .................. 118/50.1
4,675,265 6/1987 Kazama et al. ........................ 430/67
4,737,379 4/1988 Hudgens et al. ....................... 427/39
4,883,686 11/1989 Doehler et al. ....................... 427/38
4,910,041 3/1990 Yanagihara et al. .................. 427/39
4,929,322 5/1990 Sue et al. ............................... 427/37

FOREIGN PATENT DOCUMENTS 0048428 6/1983 Japan .
0026906 5/1984 Japan .

OTHER PUBLICATIONS

Z. Has, S. Mitura & M. Clapa, "Electrical Properties Of Thin Carbon Films Obtained By R.F. Methane Decomposition On An R.F.-Powered Negatively Self-Biased Electrode", vol. 136 No. 2, pp. 161–166, Feb. 1986.
D. I. Jones and A. D. Stewart "Properties of Hydrogenated Amorphous Carbon Films and the Effects of Doping" Philosophical Magazines B, vol. 46 No. 5, pp. 423–434, 1982.
Abstracts of Japan, vol. 8 No. 114, May 26, 1984, Patent No. 59-26906.
Abstracts of Japan, vol. 7 No. 132, Jun. 9, 1983, Patent No. 58-48428.
M. Danno and M. Hanabusa "Amorphous Carbon Films Prepared by Photo-CVD From Acetylene" Materials Letters, vol. 4 No. 5,6,7, pp. 261–264, Jul. 1986.

Primary Examiner—Brian E. Hearn
Assistant Examiner—B. Everhart
Attorney, Agent, or Firm—Kenyon & Kenyon

[57] ABSTRACT

The invention provides a method for making a new semiconductor base material comprising thin layers of amorphous, hydrogenous carbon (a-c:H) with a specific electrical resistance of between $10^1$ and $10^8 \Omega.cm$ and a charge carrier concentration (n+p) of between $10^{10}$ and $10^{18}$ cm$^{-3}$, respectively at room temperature. The new semiconductor base material can be manufactured in thin layer technology with the application of band processes and exhibits a charge carrier mobility of at least 1 cm$^2$.v$^{-1}$.s$^{-1}$.

11 Claims, 1 Drawing Sheet

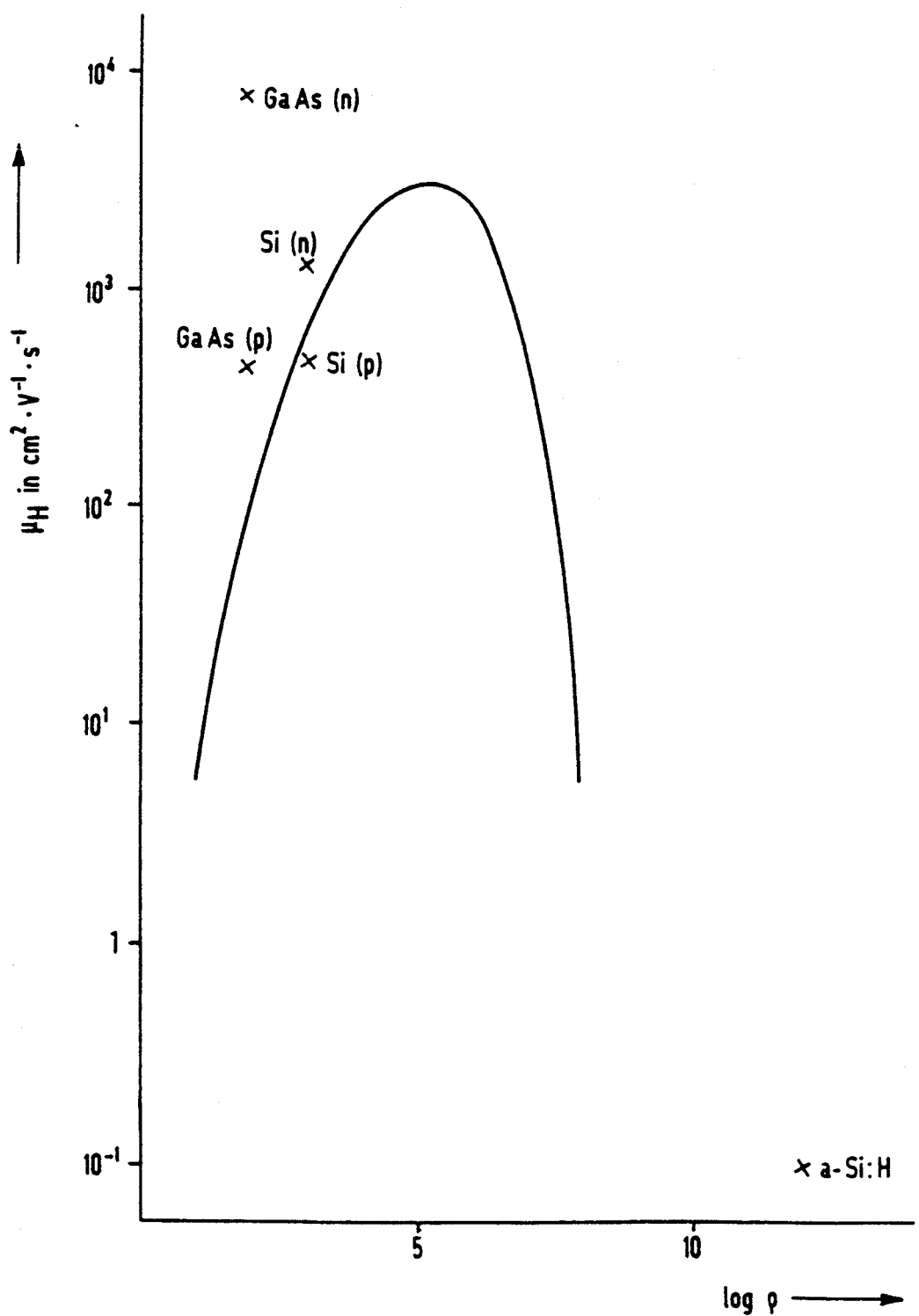

METHOD FOR THE PLASMA DEPOSITION OF HYDROGENATED, AMORPHOUS CARBON USING PREDETERMINED RETENTION TIMES OF GASEOUS HYDROCARBONS

FIELD OF THE INVENTION

The invention relates to a new semiconductor base material with high semiconductor characteristic potential consisting of thin layers of amorphous, hydrogenous, i.e. hydrogenated, carbon (a-C:H), as well as a method for producing such a semiconductor base material.

DESCRIPTION OF THE RELATED ART

Single-crystalline silicon (Si) and gallium-arsenide (GaAs) with very high n and p charge carrier mobilities ($\gg 1$ cm$^2 \cdot$V$^{-1} \cdot$s$^{-1}$) are particularly known as semiconductor base materials. The disadvantage of these materials is that they are not able to be manufactured as thin layers according to a band technology with flexible carriers and that high-temperature processes are required for their manufacture and processing.

Amorphous, hydrogenous silicon (a-Si:H) is also known as a semiconductor base material. To be sure, this material can be produced on a thin-layer base, as a rule however, its n and p charge carrier mobility lies considerably below 1 cm$^2 \cdot$V$^{-1} \cdot$s$^{-1}$ (see: J. Dresner in "Semiconductors and Semimetals", Vol. 21, Part C (1984), pages 193 ff.).

The Japanese Published Patent Application 59-26906 (dated 2/13/1984) describes an amorphous carbon material, which is manufactured—in the form of thin layers—according to the plasma CVD process (CVD=Chemical Vapor Deposition) from hydrocarbons, under the effect of an RF [radio frequency] high-frequency field. This material exhibits light-emitting and semiconductive characteristics, as well as a high degree of hardness. The light-emitting characteristic has a peak at 2.6 eV [electron volt] and the optical energy gap amounts to 3.0 eV (for a material manufactured from propane at a pressure of 40 mTorr), with a comparatively high specific electrical resistance of $10^{12}$ or $10^{13}$ $\Omega \cdot$cm.

On the other hand, from the "IDR-Industrie Diamanten Rudschau" [Industrial Diamond Magazine], volume 18 (1984), No. 4, pages 249 ff. it is known that amorphous, hydrogenous carbon (a-C:H), which has a relatively high hydrogen contents of 13 to 38 atomic percentage, possesses a specific electrical resistance of $10^{13}$ $\Omega \cdot$cm and an optical energy gap of 0.8 to 1.8 eV. The a-C:H layers are thereby manufactured, for example, through plasma deposition from benzene vapor at pressures from 1 to 5 Pa by means of high-frequency discharge.

SUMMARY OF THE INVENTION

The object of the invention is to specify a semiconductor base material, which can be manufactured in thin-layer technology with the application of band processes and without high-temperature processes and which—in an undoped state—exhibits a high mobility of the n and p charge carriers, whereby the charge carrier mobility at room temperature should amount at least to 1 cm$^2 \cdot$V$^{-1} \cdot$s$^{-1}$.

According to the invention, this is accomplished with a semiconductor base material consisting of thin layers of amorphous, hydrogenated carbon (a-C:H) with a specific electrical resistance of between $10^1$ and $10^8$ $\Omega \cdot$cm and a charge carrier concentration (n+p) of between $10^{10}$ and $10^{18}$ cm$^{-3}$, respectively at room temperature.

DETAILED DESCRIPTION OF THE INVENTION

Up until now, semiconductive thin layers with an n and p charge carrier mobility of over 1 cm$^2 \cdot$V$^{-1} \cdot$s$^{-1}$, as exhibited by the material according to the invention, have not been known in the case of amorphous semiconductors in the undoped state.

In a semiconductive material, a high mobility of both comparable with crystalline semiconductor materials, such as Si and GaAs types of charge carriers, which is significant for many applications, exists when the ratio of the corresponding Hall constants to the specific electrical resistance is as large as possible. This is the case in the semiconductor base material according to the invention, i.e. special a-C:H. In this material, where clearly fewer than 68% of the carbon atoms exhibit diamond-like, tetrahedral bonds (sp$^3$-hybridization) and clearly more than 30% exhibit graphitic, trigonal bonds (sp$^2$-hybridization), which has a hydrogen contents of 10 to 30 atomic percentage, the requirement for a high charge carrier mobility is specifically fulfilled through a fixed concentration of the n and p charge carriers and a fixed specific electrical resistance, to be precise up to an optimum. With a diminishing numerical value of the product of the charge carrier concentration and of the specific electrical resistance results an increasing ratio of the Hall constant to the specific electrical resistance, and thus a rising mobility of the charge carriers in the a-C:H layer.

Advantageously, the semiconductor material according to the invention has a specific electrical resistance of between $10^2$ and $5 \cdot 10^7$ $\Omega \cdot$cm approximately. Such a material possesses a mobility of the n and p charge carriers of over $10^2$ cm$^2 \cdot$V$^{-1} \cdot$s$^{-1}$. Preferably, the specific electrical resistance lies approximately between $5 \cdot 10^3$ and $5 \cdot 10^6$ $\Omega \cdot$cm. In such a material, the n and p charge carrier mobility attains values of over $10^3$ cm$^2 \cdot$V$^{-1} \cdot$s$^{-1}$. Incidentally, the semiconductor material according to the invention exhibits an optical energy gap of between 1.4 and 2.4 eV.

In the case of a-C:H layers with an optical energy gap of $<1.4$ eV and a specific electrical resistance of $<10$ $\Omega$cm, the mobility of the charge carrier is clearly less due to a lower Hall constant so that such materials—in the sense of the present invention—cannot be considered as semiconductor base materials. On the other hand, in the case of a-C:H layers with a specific electrical resistance of $>10^8$ $\Omega \cdot$cm, the resistance counteracts an increase in the Hall mobility of the charge carriers. Relative to the electrical resistance, such a-C:H layers are comparable to a-Si:H layers, where the charge carrier mobility lies below 1 cm$^2 \cdot$V$^{-1} \cdot$s$^{-1}$.

The invention also relates to amorphous, hydrogenated carbon, that is a-C:H, which exhibits a Hall mobility for the n and p charge carriers of $\geq 1$ cm$^2 \cdot$V$^{-1} \cdot$s$^{-1}$. Such a semiconductor base material can be obtained through high-frequency plasma deposition of gaseous hydrocarbons with an average retention time of the hydrocarbons in the plasma of at least 15 ms; the retention time is thereby defined as the quotient of the product of plasma volume and gas pressure and of the mass flow rate.

The semiconductor base material according to the invention, that is the amorphous, hydrogenous carbon, is manufactured through high-frequency plasma deposition of gaseous hydrocarbons. It is thereby important to the invention, that the average retention time of the hydrocarbons in the plasma amounts at least to 15 ms. The retention time t is defined as above, that is $t = p \cdot V \cdot m_v^{-1}$; thereby p=gas pressure (in Pa), V=plasma volume (in cm$^3$) and $m_v$=mass flow rate (in Pa·cm$^3$·s$^{-1}$).

Semiconductive a-C:H layers with a charge carrier mobility of $\geq 1$ cm$^2 \cdot$V$^{-1} \cdot$s$^{-1}$ (in the undoped state) have not been known up until now, as already explained above. Accordingly, up until now, no method is known for producing these types of layers, and therefore information is lacking concerning relevant process parameters. In particular, there is no reference in the prior art to the fact that to attain a specific Hall mobility of the charge carriers in a-C:H layers, the reaction gas used for plasma deposition, that is the hydrocarbons, must exhibit a highly specific retention time in the plasma, that is a retention time of at least 15 ms. At a retention time of $\geq 15$ ms namely, charge carrier mobilities of $\geq 1$ cm$^2 \cdot$V$^{-1} \cdot$s$^{-1}$ are achieved. Preferably, the retention time of the hydrocarbon molecules in the plasma zone amounts to between 50 and 500 ms.

A retention time in the order of magnitude mentioned above is able to be achieved—at a given cross-section of the reaction vessel used for plasma deposition—only with a specific ratio between the gas pressure, that is the partial pressure of the reaction gas, and the mass flow rate. In the case of the method according to the invention, the gas pressure advantageously amounts to 5 to 400 Pa, preferably 20 to 200 Pa, and the mass flow rate advantageously amounts to 0.05 to 2.10$^5$ Pa·cm$^3$·s$^{-1}$. Furthermore, in the case of the method according to the invention, it is important that the substrate, on to which a-C:H is deposited, is not heated.

To manufacture the semiconductive a-C:H layers according to the invention with a—due to high charge carrier mobilities—high semiconductive characteristic potential, a plasma deposition process with HF-excitation (HF=high frequency) is used. Preferably, the plasma deposition takes place thereby by means of radio frequency (RF), that is in the range between 0.1 and 100 MHz, for example at 13.46 MHz. The plasma deposition can also take place, however, by means of microwaves (MW), that is in the range between 0.1 and 1000 GHz, for example at 2.45 GHz.

According to the method of the invention, alkanes are preferably used as gaseous hydrocarbons, that is saturated, aliphatic hydrocarbons, such as methane, ethane and propane. In addition, however, also alkenes, that is unsaturated, aliphatic hydrocarbons, such as ethene and propene, can be used, as well as acetylene, cycloalkanes, that is saturated, cyclic hydrocarbons, such as cyclohexane, and—in the vaporous state—aromatic hydrocarbons in the form of benzene and benzene derivatives. The hydrocarbons of the type mentioned above can be employed individually or as a mixture. Also, one can add hydrogen and/or inert gases, such as helium and argon, to the hydrocarbons.

In HF discharges, in particular with RF excitation, a dc current voltage component (biasing voltage or "self bias potential") of up to approximately 1 kV, which pulsates in step with the high frequency, develops—because of space charges—in the case where the internal electrodes of the discharge device vary in size (surface ratio $\leq 0.5$, preferably between 0.25 and 0.05). This dc voltage component superimposes the HF ac voltage and turns the smaller electrode into a cathode. In this manner, the charged $C_xH_y$ particles, which develop as the result of ionization and fragmentation of the reaction gas, are accelerated toward the cathode and are deposited with high kinetic energy on the substrate arranged in front of the cathode—with the formation of a-C:H. A "self-bias" effect of the previously mentioned type is effective, although to a much lesser degree—due to the lack of internal electrodes—even in MW-induced deposition plasmas, because a potential difference exists in any case between the plasma and the substrate surface.

In plasmas used for a-C:H deposition, the biasing voltage determines to a strong degree the passive physico-chemical properties of the layers formed, such as hardness, scratch resistance and refractive index, however, to a lesser degree, the mobility of the n and p charge carriers. A Hall mobility of the charge carriers, which one strives for in many applications, of over 1 cm$^1 \cdot$V$^{-1} \cdot$s$^{-1}$ in the undoped a-C:H is attained on the contrary, when—according to the invention—the ratio of the Hall constant to the specific electrical resistance is large.

The above mentioned condition can be selectively fulfilled through a specific chemical structure of the a-C:H layers, in particular through a specific ratio of sp$^2$—to sp$^3$—bond portions of the C-atoms with the saturation of free C-valencies ("dangling bonds") through H-atoms. The chemical structure of the a-C:H layers, on the other hand, depends on the relative concentration of the species H, C$_2$ and CH in the plasma, which can be influenced and controlled by the plasma conditions, in particular supplied electrical power, frequency of the HF excitation, electrode shape and size, partial pressure of the reaction gas, mass flow rate and admixture of inert gases. To attain a sufficient concentration of the species H, C$_2$ and CH in the plasma, according to the invention, the plasma is preferably supplied, therefore, with an electrical power of between 0.2 and 10 W·cm$^{-3}$.

The invention shall be explained in greater detail in the following based on examples.

EXAMPLE

Methane (CH$_4$) is introduced as a reaction gas into an apparatus for plasma deposition by means of high-frequency discharge, that is into its cylindrical vacuum chamber made of glass. By way of a narrow annular clearance, the reaction gas attains the plasma volume of approximately 45 cm$^3$ forming between two planar electrodes of different sizes (surface ratio of the electrodes: 1:4). The two electrodes, that is the ground electrode (anode) and the HF electrode (cathode) are connected to a RF generator (13.56 MHz). With a HF power density of approximately 8 W·cm$^{-3}$ in the plasma volume, a biasing voltage of approximately 1 kV arises between the two electrodes. The smaller of the two electrodes thereby becomes the cathode, on which the a-C:H deposition takes place.

Under the above mentioned conditions and with an unheated substrate, one attains—at a partial pressure of the reaction gas of 100 Pa and a mass flow rate of 0.88·10$^5$ Pa·cm$^3$·s$^{-1}$—with a retention time of 51 ms semiconductive a-C:H layers, with a Hall mobility of the n charge carriers over 10 cm$^2 \cdot$V$^{-1} \cdot$s$^{-1}$.

Methane is introduced as a reaction gas—through a central supply line—into the cylindrical glass vacuum chamber of an apparatus for plasma deposition. The cathode is planar, while the anode has a cup-shaped design; the surface ratio of the electrodes amounts to 1:6. The a-C:H deposition takes place by means of radio frequency (13.56 MHz) with the following conditions: partial pressure of the reaction gas: 20 Pa; plasma volume: 400 cm$^3$; mass flow rate: $0.32 \cdot 10^5$ Pa·cm$^3$·s$^{-1}$. With a retention time of 250 ms and a power density in the plasma of 0.8 W·cm$^{-3}$, semiconductive a-C:H layers are obtained—in the case of an unheated substrate—with a Hall mobility of the n charge carriers of approximately $10^3$ cm$^2$·V$^{-1}$·s$^{-1}$.

In FIG. 1, the Hall mobility $\mu_H$ of the n and p charge carriers of the a-C:H layers, according to the invention, is represented as a function of the specific electrical resistance $\rho$. In addition, the values for crystalline Si and GaAs as well as for a-Si:H are given.

We claim:

1. A method for manufacturing a semiconductor base material with high semiconductor characteristic potential comprising the step of depositing a thin layer amorphous, hydrogenous carbon (a-C:H) onto a substrate by high-frequency plasma deposition of gaseous hydrocarbons, wherein the average retention time of the hydrocarbons in the plasma is at least 15 ms, the retention time being defined as the quotient of the product of the plasma volumes and gas pressure and of the mass flow rate, wherein the power density in the plasma is from 0.2 to 10 W·cm$^{-3}$, and wherein the substrate is not heated.

2. The method according to claim 1, wherein the average retention time is from 50 to 500 ms.

3. The method according to claim 1 wherein the gas pressure is from 5 to 400 Pa.

4. The method according to claim 1 wherein the gas pressure is from 5 to 400 Pa.

5. The method according to claim 1 wherein the mass flow rate is from $0.05 \times 10^5$ to $2 \times 10^5$ Pa·cm$^3$s$^{-1}$.

6. The method according to claim 1 wherein the plasma deposition takes place by means of radio frequency.

7. The method according to claim 1 wherein alkanes are used as hydrocarbons.

8. The method according to claim 2 wherein the gas pressure is from 5 to 400 Pa.

9. The method according to claim 2 wherein the mass flow rate is from $0.05 \times 10^5$ to $2 \times 10^5$ Pa·cm$^3$·s$^{-1}$.

10. The method according to claim 2 wherein the plasma deposition takes place by means of radio frequency.

11. The method according to claim 2 wherein alkanes are used as hydrocarbons.

* * * * *

UNITED STATES PATENT AND TRADEMARK OFFICE
CERTIFICATE OF CORRECTION

PATENT NO. : 5,055,421

DATED : October 8, 1991

INVENTOR(S) : Siegfried BIRKLE, et al.

It is certified that error appears in the above-identified patent and that said Letters Patent is hereby corrected as shown below:

On the title page: Item

[54], line 5, after "HYDROCARBONS" add --IN THE PLASMA--.

[57], line 3, change "hydrogenous" to --hydrogenated--.

[57], line 10, change "$cm^2.v^{-1}.s^{-1}$" to --$cm^2.V^{-1}.s^{-1}$--.

Column 1, line 5, after "HYDROCARBONS" add --IN THE PLASMA--.

Column 1, line 46, change "Rudschau" to --Rundschau--.

UNITED STATES PATENT AND TRADEMARK OFFICE
CERTIFICATE OF CORRECTION

PATENT NO. : 5,055,421

DATED : October 8, 1991

INVENTOR(S) : Siegfried BIRKLE, et al.

It is certified that error appears in the above-identified patent and that said Letters Patent is hereby corrected as shown below:

Column 1, line 63, after "carriers" insert -- comparable with crystalline semiconductor materials, such as Si and GaAs--.

Column 2, lines 14 to 15, delete "comparable with crystalline semiconductor materials, such as Si and GaAs".

Column 4, line 46, change "EXAMPLE" to --EXAMPLES--.

UNITED STATES PATENT AND TRADEMARK OFFICE
CERTIFICATE OF CORRECTION

PATENT NO. : 5,055,421

DATED : October 8, 1991

INVENTOR(S) : Siegfried, BIRKLE, et al.

It is certified that error appears in the above-identified patent and that said Letters Patent is hereby corrected as shown below:

In the Claims:

Column 5, line 23, after "layer" insert --of--.

Column 5, line 24, change "hydrogenous" to --hydrogenated--.

Column 5, line 28, delete "the" at the end of the line.

Column 6, line 1, change "volumes" to --volume--.

Column 6, line 10, change "5 to 400 Pa" to --20 to 200 Pa--.

Column 6, line 12, change "$Pa.cm^3s^{-1}$" to --$Pa.cm^3.s^{-1}$--.

Signed and Sealed this

Twenty-second Day of June, 1993

Attest:

MICHAEL K. KIRK

Attesting Officer

Acting Commissioner of Patents and Trademarks